United States Patent
Ballantine et al.

(10) Patent No.: US 6,271,100 B1
(45) Date of Patent: Aug. 7, 2001

(54) CHEMICALLY ENHANCED ANNEAL FOR REMOVING TRENCH STRESS RESULTING IN IMPROVED BIPOLAR YIELD

(75) Inventors: Arne Watson Ballantine, Cold Spring, NY (US); Douglas Duane Coolbaugh, Essex Junction; Jeffrey D. Gilbert, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,159

(22) Filed: Feb. 24, 2000

(51) Int. Cl.[7] ................................................. H01L 21/76
(52) U.S. Cl. ........................................... 438/424; 438/221
(58) Field of Search ................................. 438/424, 433, 438/444, 449, 221, 218, 296; 257/397, 519

(56) References Cited

U.S. PATENT DOCUMENTS

| | | | |
|---|---|---|---|
| 5,516,721 | 5/1996 | Galli et al. | 437/67 |
| 5,858,858 | 1/1999 | Park et al. | 438/424 |
| 5,867,420 | 2/1999 | Alsmeier | 365/149 |
| 5,893,760 | 4/1999 | Mikata et al. | 438/795 |
| 5,910,018 | 6/1999 | Jang | 438/425 |
| 5,913,125 | 6/1999 | Brouillette et al. | 438/386 |
| 5,933,748 | 8/1999 | Chou et al. | 438/431 |
| 6,084,271 | * 7/2000 | Yu et al. | 257/351 |
| 6,084,276 | * 7/2000 | Gambino et al. | 257/397 |

FOREIGN PATENT DOCUMENTS

2256967 A   12/1992   (GB) .

* cited by examiner

*Primary Examiner*—David Nelms
*Assistant Examiner*—Quoc Huang
(74) *Attorney, Agent, or Firm*—Scully, Scott, Murphy & Presser; William D. Sabo

(57) ABSTRACT

A method of substantially reducing stress in a trench comprising forming at least one trench in a substrate, said substrate having a surface; filling the at least one trench with a trench dielectric material; planarizing the filled trench stopping on said surface of said substrate; and subjecting the planarized trench to an anneal step, said anneal step being carried out under rapid thermal conditions at a temperature of about 800° C. or above and in the presence of an atmosphere comprising hydrogen.

30 Claims, 2 Drawing Sheets

CHEMICALLY ENHANCED ANNEAL FOR REMOVING TRENCH STRESS RESULTING IN IMPROVED BIPOLAR YIELD

FIELD OF THE INVENTION

The present invention relates to semiconductor device manufacturing, and in particular to a method of reducing stress in an isolation trench which includes an anneal step that is performed under rapid thermal conditions at a relatively high temperature and in the presence of an atmosphere comprising hydrogen.

BACKGROUND OF THE INVENTION

In the manufacturing of semiconductor devices, it is well known to form isolation regions that electrically isolate the various active regions present within the device from each other. One method of electrically isolating the active device regions is to form a trench isolation region between adjacent devices. Such prior art trench isolation regions typically comprise a trench that is formed within the substrate and filled with a dielectric material such as $SiO_2$.

Three types of trench isolation regions are known: including shallow trenches (trenches whose depth is less than about 1 $\mu$m), moderate trenches (trenches whose depth is from about 1 to about 3 $\mu$m), and deep trenches (trenches whose depth is greater than 3 $\mu$m).

Shallow trench isolation (STI) regions are the choice of device isolation used in bipolar technologies. Despite this, the presence of STI regions in bipolar devices has some drawbacks associated therewith. In particular, it is well known that bipolar pipe yield can be affected by dislocations originating at the corner of the STI region. This problem has been shown to be caused by the stress in the isolation trench due to over oxidation during the semiconductor processing.

Several approaches have been attempted in order to reduce the stress problem in the STI region. Some of the more common prior art attempts for reducing stress include: reducing the amount of oxidation in the trench as well as reducing the level of Si interstitials at the base of the STI using a sink such as C implants. Others have shown that stress in the trench may be reduced by relaxation of the tetraethylorthosilicate (TEOS) trench dielectric material thru high temperature anneals.

To date, no effective method is known which is capable of substantially reducing the stress in the trench isolation region. As such, there is a continued need for developing a new and improved method that can adequately reduce the stress of the trench isolation region caused by over oxidation during the manufacturing of the semiconductor device. Such a method would represent a significant advancement in the art since it would lead to increase bipolar pipe yield.

SUMMARY OF THE INVENTION

The present invention relates to a method of substantially reducing stress in an isolation trench (shallow, moderate or deep) by using an anneal step that is performed under rapid thermal conditions at relatively high temperatures and in an atmosphere comprising hydrogen. Specifically, the method of the present invention comprises the steps of:

(a) forming at least one trench in a substrate, said substrate having a surface;

(b) filling the at least one trench with a trench dielectric material;

(c) planarizing the filled trench stopping on said surface of said substrate; and (d) subjecting the planarized trench to an anneal step, said anneal step being carried out under rapid thermal conditions at a temperature of about 800° C. or above and in the presence of an atmosphere comprising hydrogen.

DESCRIPTION OF THE INVENTION

Figure 1A:
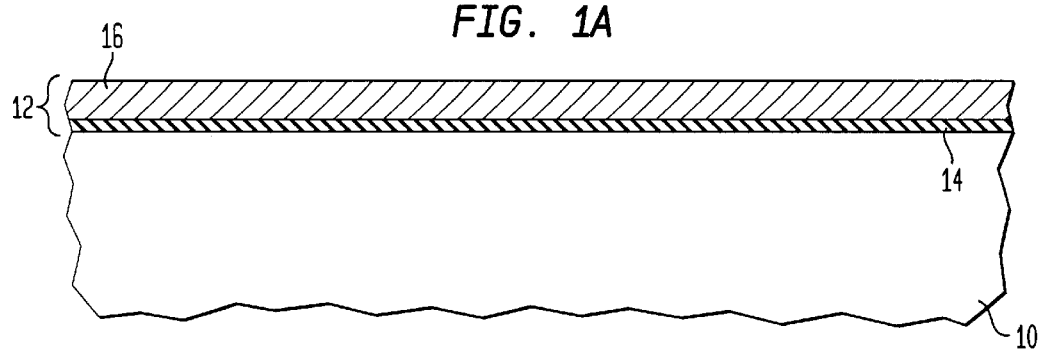
FIGS. 1A–E illustrate the basic processing steps used in the method of the present invention in forming a structure having a trench isolation region that is substantially free of stress.

The present invention which provides a method of fabricating a trench isolation region that is substantially free of stress will now be described in greater detail by referring to the drawings that accompany the present invention. It should be noted that in the accompanying drawings like reference numerals are used for describing like and/or corresponding elements.

The method of the present invention is applicable in reducing stress of any isolation trench including: shallow trench isolation (STI) regions, moderate trenches and deep trenches. Of these isolation trenches, the present invention is highly applicable for use in reducing stress of STI regions. It is thus noted that although the following description is specific for STI regions, the processing steps described hereinbelow can also be used in fabricating moderate or deep trenches. The method of the present invention is also suitable for use when a device containing any combination of isolation trenches is to be fabricated.

Reference is made to FIGS. 1A–1E which illustrate the basic processing steps that are employed in the present invention. Specifically, FIG. 1A comprising an initial structure that can be used in the present invention in forming a trench isolation region in a substrate. Specifically, the structure shown in FIG. 1A comprises a substrate 10 that contains film stack 12 formed on one of its surfaces.

Substrate 10 may be composed of any conventional semiconducting material including, but not limited to: Si, Ge, SiGe, GaAs, InAs, InP and all other III/V semiconductor compounds. The substrate may also be composed of a layered semiconductor such as Si/SiGe. In a preferred embodiment of the present invention, a Si-containing material such as Si, SiGe or Si/SiGe is used as substrate 10.

The substrate may be of the n-type or the p-type depending on the final device to be fabricated. The substrate may optional include various active regions either formed on the surface of the substrate or formed within the substrate prior to forming the film stack thereon.

The film stack employed in the present invention comprises various material layers that are used in defining an isolation trench. Although FIG. 1A shows a film stack comprising only two material layers, the present invention is not limited to film stacks containing two material layers. Instead, the film stack employed in the present invention may be composed of any number of material layers. In the embodiment shown in FIG. 1A, film stack 12 comprises an oxide layer 14 and a nitride layer 16.

Oxide layer 14 of film stack 12 is formed on the surface of substrate 10 using a conventional thermal growing process, or alternatively, the oxide layer may be formed by a conventional deposition process such as, but not limited to: chemical vapor deposition (CVD), plasma-assisted CVD, sputtering, evaporation and other like deposition processes.

The thickness of oxide layer 14 may vary, but the oxide layer typically has a thickness of from about 2 to about 20 nm, with a thickness of from about 5 to about 10 nm being more highly preferred. Any oxide-containing material such as $SiO_2$ can be employed as oxide layer 14.

The nitride layer of the film stack, i.e., nitride layer 16, is formed over oxide layer 14 by utilizing a conventional deposition process well known to those skilled in the art that is capable of forming a nitride layer. Illustrative examples of typically deposition processes that are employed in forming nitride layer 16 include, but are not limited to: CVD, plasma-assisted CVD, sputtering, evaporation and other like deposition processes. The thickness of nitride layer 16 may vary, but the nitride layer of the film stack typically has a thickness of from about 50 to about 300 nm, with a thickness of from about 100 to about 160 nm being more highly preferred. Any material capable of forming a nitride layer such as $Si_3N_4$ and Si oxynitride may be employed in the present invention.

Figure 1B:
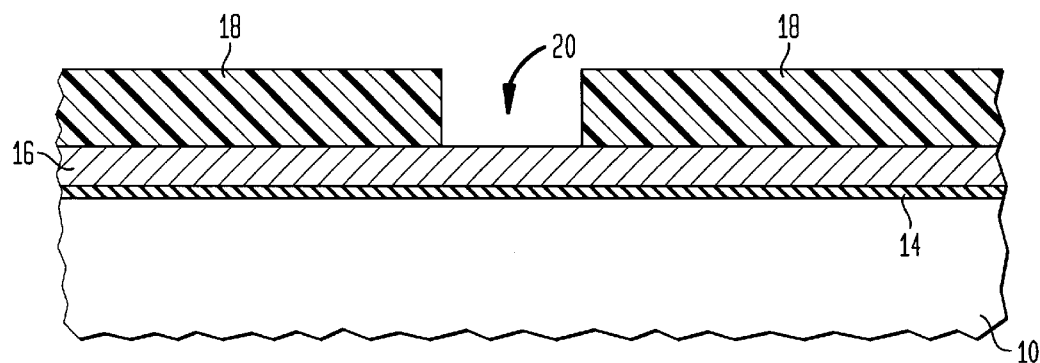
Figure 1C:
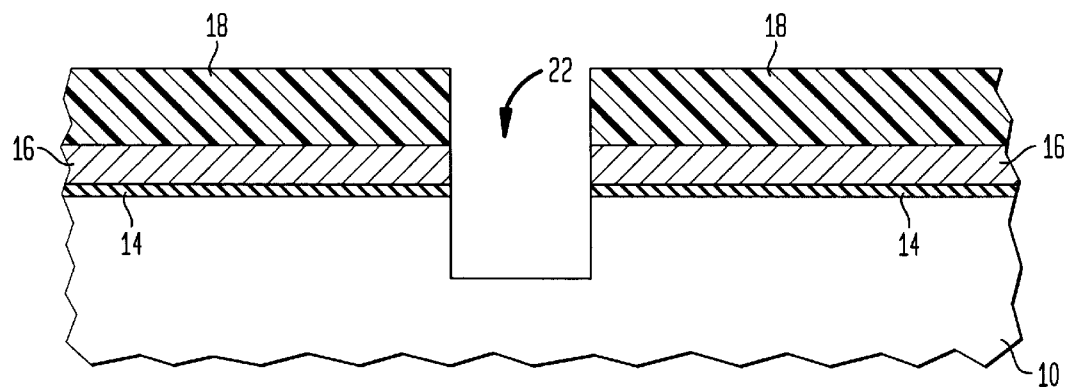

Next, as shown in FIGS. 1B–1C, the various layers of the film stack are patterned so as to form trench 22 within the substrate; note during the trench etch, sidewalls of the various layers present in the film stack are exposed. Although the drawings depict the formation of only one trench in the structure, the present invention can be used in forming a plurality of trenches in the substrate.

Specifically, photoresist is formed on the exposed surface layer of nitride layer 16 utilizing a conventional deposition process. The photoresist layer is then patterned providing patterned photoresist 18 utilizing conventional lithography so as to expose selective regions of the film stack in which trenches are to be formed (See, FIG. 1B, reference numeral 20 denotes the exposed region provided by this step of the present invention). The lithography step employed in the present invention includes exposing the photoresist to radiation to form a pattern in the photoresist and developing the pattern. Since such steps are well known to those skilled in the art, a detailed description of the same is not needed herein.

Trench 22 (see, FIG. 1C) is then formed by etching the various layers of the film stack utilizing a conventional dry etching process such as RIE, ion-beam etching, plasma etching or any other like dry etch process. A combination of the aforementioned dry etch processes may also be used in providing the trench. Following trench etch, patterned photoresist 18 is removed by a conventional stripping process.

Figure 1D:
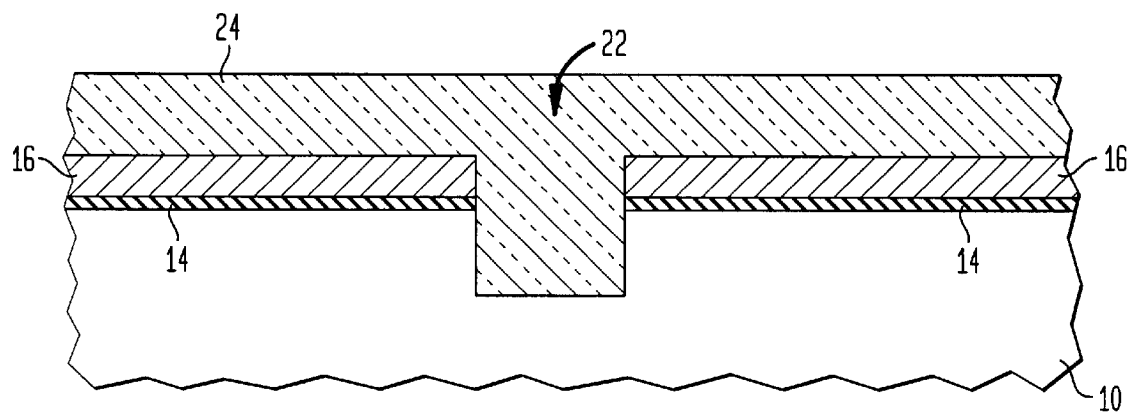

The next step of the present invention, which is shown in FIG. 1D, comprises filling the trench with a trench dielectric material 24. The trench dielectric material is formed in the trench utilizing conventional deposition processes including, but not limited to: CVD, plasma-assisted CVD, sputtering and other like deposition processes. Suitable trench dielectric materials that can be employed in the present invention include, but are not limited to: tetraethylorthosilicate (TEOS), $SiO_2$, flowable oxides and other like dielectric materials. When TEOS is employed, an optional densification step may be employed prior to planarization. It is noted that the deposition process employed in the filling the trench also forms a layer of the trench dielectric material on top of the nitride layer of the film stack, See FIG. 1D.

Prior to filling the trench with a trench dielectric material, a barrier layer may be formed in the trench utilizing a conventional thermal growing process, or alternatively by deposition utilizing a conventional deposition process selected from the group consisting of CVD, plasma-assisted CVD, sputtering, evaporation and other like deposition techniques. Any material that can be used to prevent interaction of the substrate with the trench dielectric material can be used in the present invention as the optional barrier layer. For example, $SiO_2$ or $Si_3N_4$ can be used as the optional barrier layer. It should be noted that the isolation trench comprises dielectric trench material 24 and, when present, the optional barrier layer.

Figure 1E:
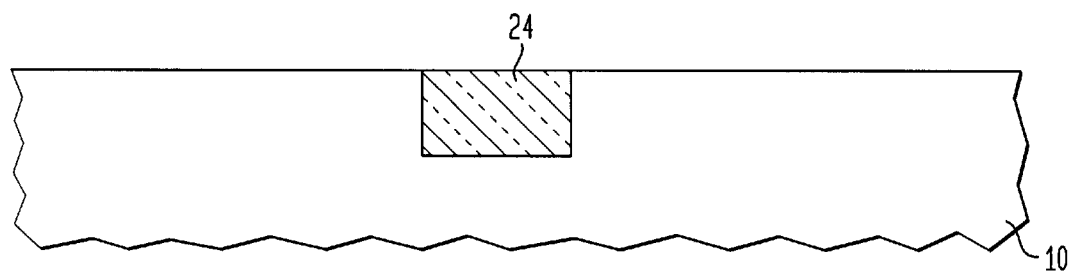

Next, as shown in FIG. 1E, the structure thus formed is then planarized down to the surface of the substrate utilizing a conventional planarization process such as chemical-mechanical polishing (CMP) or grinding. During the planarization step, the various layers of the film stack, i.e., oxide layer 14 and nitride layer 16, are removed. the planarization step, the structure shown in FIG. 1E is then subjected to an anneal step. The anneal step performed in the present invention is a rapid thermal anneal process that is carried out in the presence of an atmosphere comprising hydrogen. A relatively high temperature of at least about 800° C. or above is used and the anneal is carried out for a time period of 300 seconds or less. Preferably, the anneal step is carried out at a temperature of from about 900° C. to about 1000° C. for a time period of from about 5 to about 60 seconds. More preferably, the anneal step is carried out at a temperature of from about 900° C. to about 950° C. for a time period of from about 5 to about 20 seconds.

Although atmospheric pressure may be used, the present invention prefers that a reduced pressure relative to atmospheric be employed during the anneal step. Preferably, the anneal step is carried out a pressure of about 100 Torr or less, with a pressure of about 10 Torr or less being more highly preferred.

As stated above, the anneal step is carried out in an atmosphere of hydrogen. Hydrogen may be used alone, or in some embodiments of the present invention, hydrogen may be admixed with an inert gas such as He, Ar or $N_2$. Mixtures of these inert gases may also be used in the present invention.

The above anneal step has been shown by applicants to reduce stress of the STI/substrate corners. Moreover, in one application, a 15% improvement in bipolar pipesite yield was observed when the method of the present invention was employed.

Without wishing to be bound by any theory, applicants believe that the anneal causes a reduction of the $SiO_2$ in the trench, while $H_2$ at the above described temperatures is believed to cause the $SiO_2$ to relax potentially due to the relaxation of high stress regions to form low energy stressed states.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim is new, and desire to secure by the Letters Patent is:

1. A method of substantially reducing stress in a trench comprising:
   (a) forming at least one trench in a substrate, said substrate having a surface;
   (b) filling the at least one trench with a trench dielectric material;
   (c) planarizing the filled trench stopping on said surface of said substrate; and (d) subjecting the planarized trench to an anneal step so as to substantially reduce stress at corner regions that exist between the planarized trench and said substrate, said anneal step is carried out under rapid thermal conditions at a temperature of about 800° C. or above and in the presence of an atmosphere comprising hydrogen.

2. The method of claim 1 wherein said substrate is composed of Si, Ge, SiGe, GaAs, InAs, InP or a layered semiconductor.

3. The method of claim 2 wherein said substrate is composed of Si, SiGe or a layered Si/SiGe substrate.

4. The method of claim 1 wherein step (a) includes forming a film stack on the surface of said substrate, forming a patterned photoresist on said film stack, said pattern exposing regions of said film stack in which said at least one trench is to be formed and etching said at least one trench through said exposed regions of said film stack.

5. The method of claim 4 wherein said film stack comprises an oxide layer and a nitride layer, said oxide layer being formed on said surface of said substrate.

6. The method of claim 5 wherein said oxide layer of said film stack is thermally grown or deposited.

7. The method of claim 6 wherein said oxide layer of said film stack is deposited by chemical vapor deposition (CVD), plasma-assisted CVD, sputtering or evaporation.

8. The method of claim 5 wherein said oxide layer of said film stack has a thickness of from about 2 to about 20 nm.

9. The method of claim 8 wherein said oxide layer of said film stack has a thickness of from about 5 to about 10 nm.

10. The method of claim 5 wherein said nitride layer of said film stack is formed by a deposition process selected from the group consisting of CVD, plasma-assisted CVD, evaporation and sputtering.

11. The method of claim 5 wherein said nitride layer of said film stack has a thickness of from about 50 to about 300 nm.

12. The method of claim 11 wherein said nitride layer of said film stack has a thickness of from about 100 to about 160 nm.

13. The method of claim 4 wherein said patterned photoresist is formed utilizing a lithography step.

14. The method of claim 13 wherein said lithography step includes applying a photoresist to said film stack, patterning the photoresist by exposure, and developing the pattern in said photoresist.

15. The method of claim 4 wherein said etching step includes a dry etching process selected from the group consisting of reactive-ion etching (RIE), ion-beam etching, plasma etching or any combination thereof.

16. The method of claim 1 wherein said filling step comprises a deposition process selected from the group consisting of CVD, plasma-assisted CVD and sputtering.

17. The method of claim 1 wherein said trench dielectric material is tetraethylorthosilicate (TEOS), $SiO_2$ or a flowable oxide.

18. The method of claim 17 wherein said trench dielectric material is TEOS and a densification step is employed prior to said planarizing.

19. The method of claim 1 wherein a barrier layer is formed in said at least one trench prior to filling with said trench dielectric material.

20. The method of claim 1 wherein said planarizing step comprises chemical-mechanical polishing or grinding.

21. The method of claim 1 wherein said anneal step is carried out for a time period of 300 seconds or less.

22. The method of claim 1 wherein said anneal step is carried out at a temperature of from about 900° C. to about 1000° C. for a time period of from about 5 to about 60 seconds.

23. The method of claim 22 wherein said anneal step is carried out at a temperature of from about 900° C. to about 950° C. for a time period of from about 5 to about 20 seconds.

24. The method of claim 1 wherein said anneal step is carried out at atmospheric pressure or in a reduced pressure relative to atmospheric.

25. The method of claim 1 wherein said anneal step is carried out at a pressure of about 100 Torr or less.

26. The method of claim 25 wherein said anneal step is carried out at a pressure of about 10 Torr or less.

27. The method of claim 1 wherein said atmosphere of hydrogen comprises hydrogen alone or hydrogen admixed with an inert gas.

28. The method of claim 27 wherein said inert gas is He, $N_2$, Ar or mixtures thereof.

29. The method of claim 1 wherein said at least one trench is a shallow isolation trench, a moderate isolation trench, a deep isolation trench or any combinations thereof.

30. The method of claim 29 wherein said at least one trench is a shallow isolation trench.

\* \* \* \* \*